United States Patent [19]

Albrecht et al.

[11] Patent Number: 4,990,990

[45] Date of Patent: Feb. 5, 1991

[54] MONOLITHICALLY INTEGRATED WAVEGUIDE-PHOTODIODE-FET COMBINATION

[75] Inventors: Helmut Albrecht, Munich; Reiner Trommer, Stockelsdorf, both of Fed. Rep. of Germany

[73] Assignee: Siemens Aktiengesellschaft, Berlin and Munich, Fed. Rep. of Germany

[21] Appl. No.: 445,693

[22] PCT Filed: Mar. 23, 1988

[86] PCT No.: PCT/DE88/00184

§ 371 Date: Dec. 4, 1989

§ 102(e) Date: Dec. 4, 1989

[87] PCT Pub. No.: WO88/08205

PCT Pub. Date: Oct. 20, 1988

[51] Int. Cl.$^5$ ............... H01L 27/14; H01L 33/00; H01L 29/161

[52] U.S. Cl. ............... 357/30; 357/15; 357/16; 357/17; 357/19; 357/22; 357/49; 357/55

[58] Field of Search ............... 357/16, 17, 19, 30 B, 357/30 D, 30 E, 30 I, 30 L, 15, 22 A, 22 MD, 22 B, 22 F, 22 I, 22 H, 49, 55

[56] References Cited

U.S. PATENT DOCUMENTS

| | | | |
|---|---|---|---|
| 3,952,265 | 4/1976 | Hunsperger | 357/19 |
| 4,360,246 | 11/1982 | Figueroa et al. | |
| 4,730,330 | 3/1988 | Plihol et al. | 357/19 |
| 4,772,787 | 9/1988 | Trommer | 357/30 P |
| 4,773,074 | 9/1988 | Hunsperger et al. | 357/19 |
| 4,815,090 | 3/1989 | Usami et al. | 357/19 |
| 4,884,112 | 11/1989 | Lorenzo et al. | 357/17 |

FOREIGN PATENT DOCUMENTS

| | | |
|---|---|---|
| 0133709 | 3/1985 | European Pat. Off. |
| 0192850 | 9/1986 | European Pat. Off. |
| 61-191065 | 8/1986 | Japan ............... 357/30 E |

OTHER PUBLICATIONS

American Institute of Physics, Appl. Phys. Lett. 49, Jul. 28, 1986, pp. 215-217, "Planar Monolithic Integrated Photoreceiver for 1.3-1.55 $\mu$m Wavelength Applications Using GaInAs-GaAs Heteroepitaxies".
American Institute of Physics, Appl. Phys. Lett. 48, May 26, 1986, pp. 1461-1463, "Optoelectronic Integrated AlGaAs/GaAs p-i-n/Field-Effect Transistor with an Embedded, Planar p-i-n Photodiode".
IEEE Transactions On Electron Devices, vol. ED-32, No. 11, Nov. 1985, pp. 2319-2321, "Monolithic Integration of a Planar Embedded InGaAs p-i-n Detector with InP Depletion-Mode FET's."
IEEE Transactions On Electron Devices, vol. ED-32, No. 12, Dec. 1985, pp. 2662-2668, "Low Loss GaAs Optical Waveguides".
Appl. Phys. Lett. 45 (3), Aug. 1, 1984, pp. 195-196.
IEEE Trans. Elect. Devices, vol. ED-32, No. 12, Dec. 1985, pp. 2713-2715, "A Hermetic Fiber-Coupled p-i-n Photodetector Package for use in Fiber-Optic Preamplifier Circuits".
IEEE Trans. Electr. Devices, vol. ED-33, No. 9, Sep. 1986, pp. 1385-1386.
Siemens Forsch u. Entwickl-Ber Bd 14 (1985) Nr. 6, pp. 295-298.
Appl. Phys. Lett. vol. 22, No. 9, May 1, 1973, "Integrated Optical Photodetector", pp. 463-464.
Appl. Phys. Lett. vol. 25, No. 1, Jul. 1, 1974, pp. 36-38.
Electronics Letter, Jan. 2nd 1987, vol. 23, No. 1, pp. 2-4.
IEEE Journal of Quantum Electronics, vol. QE-22, No. 6, Jun. 1986, pp. 805-821.
Japanese Abstract, Jan. 20, 1987, vol. 11, No. 20 (E-472) (2647).

*Primary Examiner*—Andrew J. James
*Assistant Examiner*—Ngan Van Ngo
*Attorney, Agent, or Firm*—Hill, Van Santen, Steadman & Simpson

[57] ABSTRACT

Monolithically integrated waveguide-photodiode-FET combination comprising waveguide layer (2), photodiode layer (3), FET layer (4) and a common cover layer (5) applied on a carrier substrate (1) of III-V semiconductor material, having butt coupling between waveguide layer (2) and photodiode layer (3), having introduced dopings for fashioning photodiodes and FETs and having a parting region (19) for the limitation of photodiodes and FETs.

8 Claims, 1 Drawing Sheet

MONOLITHICALLY INTEGRATED WAVEGUIDE-PHOTODIODE-FET COMBINATION

The present invention is directed to a monolithically integrated waveguide-photodiode-FET combination for integration in optical communications systems including a carrier substrate of III-V semiconductor material, a photodiode layer of semiconductor material, a FET layer of semiconductor material, a first region of the photodiode doped for electrical conduction of a first conductivity type, a second region of the photodiode doped for electrical conduction of a second conductivity type, a source region, a channel region, a drain region, a gate region, a first contact on the second region of the photodiode, a second contact on the first region of the photodiode, a source contact on the source region, a drain contact on the drain region, and a gate contact on the gate region.

The development of optical data transmission systems is tending to utilize integrated opto-electronic circuits for the connection between optical and electronic components. The problem of monolithic integration of light waveguides, photodetectors and pre-amplifiers in one component arises at the receiver side. Good compatibility of the semiconductor layers and technologies required for the various components as well as a good coupling efficiency between waveguide and photodetector are demanded. Closed concepts for the integration of light waveguide, photo-detector and transistor are not known. Essentially three concepts have been previously proposed for the waveguide-photodiode combination.

The out-coupling of the radiation into the diode in the first of these concepts ensues on the basis of a suitable deflection of the beam direction into the photodiode. The realization of such an arrangement is described, for example in the publication by D. B. Ostrowsky et al, "Integrated Optical Photodetector", Appl. Phys. Lett. 22, 463-464 (1973). Formats of waveguide-photodiode combinations that deviate therefrom wherein the radiation is coupled out of the waveguide by deflection are disclosed in the Patent Applications EP 0 187 198 and EP 0 192 850.

A second possibility of radiation out-coupling is comprised in leakage wave coupling that, for example, is realized in the structure recited in the publication by C. Bornholdt et al., "Waveguide-integrated PIN photodiode InP", Electr. Lett. 23, 2-3 (1987).

The third concept provides butt coupling. One embodiment thereof may be found in the publication by G. E. Stillman et al, "Monolithic Integrated $In_xGa_{1-x}As$ Schottky-barrier Waveguide Photodetector", Appl. Phys. Lett. 25, 36-38 (1974).

A number of concepts for the integration of photodetector and field effect transistor have been published, these being described in the survey by O. Wada, IEEE J. Quantum Electr. OE-22, 805-821 (1986). The reason for the various concepts for the integration of photodetector and field effect transistor lies in the different physical properties of these components, specifically in the different structure of the semiconductor layers in terms of geometry and doping. In order to nonetheless enable a planar chip structure, buried photodetector structures and/or FET structures have been proposed. Barrier layer field effect transistors (JFET), metal-semiconductor field effect transistors (MESFET) and metal-insulator-semiconductor field effect transistors (MISFET) thereby come into consideration as FET structures.

It is an object of the present invention to specify an optimally easily manufacturable layer structure for the monolithic integration of waveguide, photodetector and transistor in a common component part having high efficiency.

In an arrangement of the invention, this object is achieved by a monolithically integrated photodiode-FET combination in which a waveguide layer of semiconductor material is provided along with a photodiode layer and a FET layer which are grown positioned next to one another on a carrier substrate, the waveguide layer and the photodiode layer abutting one another. The waveguide layer, the photodiode layer and the FET layer are lightly doped for electrical conduction of a first conductivity type and are positioned to form a planar surface. A cover layer of semiconductor material is grown on the planar surface. First and second regions of the photodiode are formed in the cover layer over the photodiode layer and each extend into the photodiode layer. A third region of the photodiode is doped for electrical conduction of the first conductivity type and is formed in the carrier substrate adjoining the photodiode layer and extending along the entire length thereof. The second region of the photodiode is highly doped while the first and third regions of the photodiode are very highly doped. The FET includes a source region and a drain region which are very highly doped for electrical conduction of the first conductivity type and are formed in the cover layer over the FET layer and extending into the FET layer. A channel region which is highly doped for electrical conduction of the first conductivity type and a gate region which is formed in the cover layer are also provided. A parting region separates the photodiode from the FET, and that portion of the surface of the cover layer which is not provided with contacts is covered with a passivation layer.

The semiconductor layer structure for a component of the invention is composed of a carrier substrate—preferably semi-insulating InP—onto which a lightly n-conductively doped waveguide layer—preferably (InGa) (As,P) or (In,Ga As—as well as a lightly n-conductively doped photodiode layer—preferably (In, Ga) As—that serves as absorption layer for the photodiode and as channel layer for the field effect transistor that are deposited by local epitaxy onto the substrate in those regions provided for the waveguide, photodiode or, respectively, FET. A closed, lightly n-conductively doped cover layer—preferably InP or (In,Al) As —serves as envelope layer for the waveguide and as passivating layer for the photodiode and for the field effect transistor.

The waveguide, for example, can thereby be executed in strip form. The p-region of the photodiode is fashioned by $p^+$-diffusion or $p^+$ implantation in the region of the junction between the waveguide layer and absorption layer. The light emerging from the waveguide is absorbed in the photodiode layer and generates the photocurrent. The n-contact of the photodiode is laterally applied over a first n-region. A second n-region of the photodiode that is situated immediately under the photodiode layer in the carrier substrate and that is highly n-conductively doped keeps the series resistance of the photodiode low.

The advantage of the butt coupling especially lies in a good coupling efficiency and a small diode area.

The field effect transistor is separated from the photodiode by a parting region that is etched out trench-shaped or that is fashioned by insulator implantation. The doping profile required for the FET is set in the channel region with, for example, ion implantation. The strip-shaped gate composed of the gate region in the semiconductor and of applied gate contact is fashioned as a junction gate with p$^+$-diffusion or p$^+$-implantation or as a Schottky gate. Source and drain regions are highly n-conductively doped and are provided with source contact or, respectively drain contact. The fashioning of the FET can correspond to one of the standard, embodiments.

Figure 1:
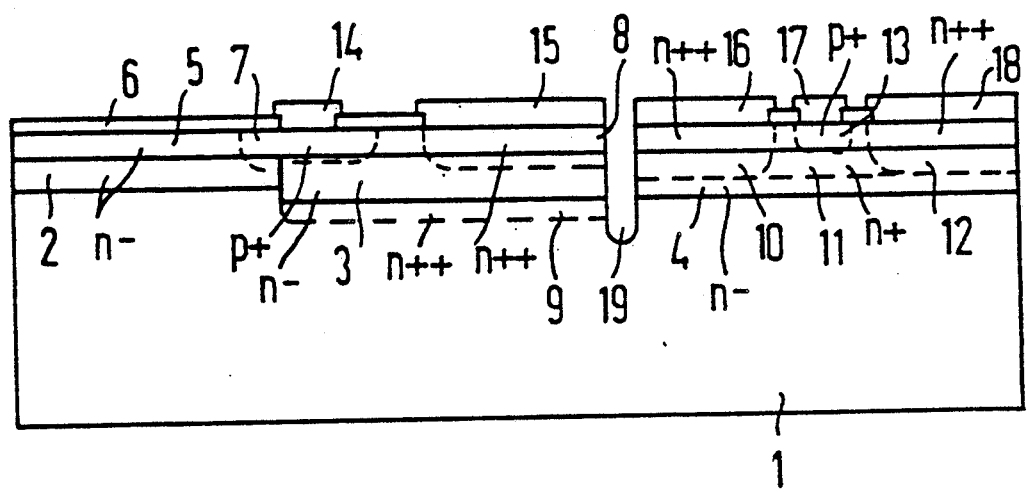
FIG. 1 is a cross section of a first exemplary embodiment of a monolithically integrated waveguide-photodiode-FET according to the principles of the present invention.

The description of the exemplary embodiment shown in cross-section in FIG. 1 now follows:

A waveguide layer that is composed of lightly n-conductively doped semiconductive material—for example, $In_{0.9}Ga_{0.1}As_{0.8}P_{0.2}$—and is usually fashioned strip-shaped is epitaxially grown on the carrier substrate 1 of InP material that, for example, was rendered semi-insulating with iron doping; this waveguide layer is structured by etching. A likewise lightly n-conductively doped semiconductor layer—for example, $In_{0.53}Ga_{0.47}As$ material—is epitaxially grown adjacent thereto as photodiode layer 3 and as FET layer 4. The waveguide layer 2 is immediately adjacent to the photodiode layer 3. Together, waveguide layer 2, photodiode layer 3 and FET layer 4 form a planar surface that is covered with a cover layer 5 that, in the present exemplary embodiment, is InP material.

A highly p-conductively doped as well as a very highly n-conductively doped region that form the p-region 7 of the photodiode or, respectively, the first n-region 8 of the photodiode are fashioned in the cover layer 5 over the photodiode layer 3. This p-region 7 and first n-region 8 are fashioned up to the surface of the cover layer 5 and into the photodiode layer 3. p-contact 14 and n-contact 15 are applied on the surface.

A second n-region 9 of the photodiode that is very highly n-conductively doped is fashioned in the carrier substrate 1 immediately under the photodiode layer 3 and extending over the entire length thereof, as a result whereof the series resistance of the photodiode is reduced.

Figure 2:
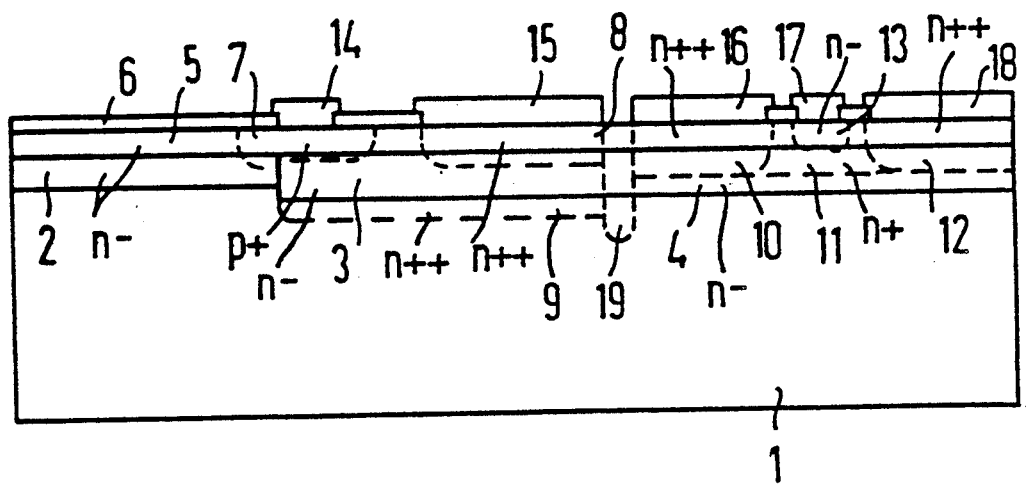
FIG. 2 is a cross section of a second exemplary embodiment of a monolithically integrated waveguide-photodiode-FET of the invention.

In a corresponding fashion, the very highly n-conductively doped source region 10 and the very highly nconductively doped drain region 12 that respectively extend to the surface of the cover layer 5 and are fashioned as far as possible into the FET layer are fashioned in the cover layer 5 over the FET layer 4. The corresponding contacts, the source contacts 16 and the drain contact 18, are applied on the surface. A highly n-conductively doped channel region 11 is formed between the source region 10 and the drain region 12, the dimension and doping profile of this channel region 11 being selected in accord with the physical properties of the transistor that are to be achieved. Given formation of a junction gate, a corresponding gate region 13 that is highly p-conductively doped is fashioned in the cover layer 5. In case a Schottky contact is e this gate region 13 is n-conductively doped as shown in FIG. 2. The gate region 13 that is fashioned in the cover layer 5 up to the surface is provided with the gate contact 17 on this surface.

Insofar as the cover layer 5 is not provided with metal contacts, a passivation layer 6 composed of a dielectric is applied on the cover layer 5. $Si_3N_4$, $SiO_2$, $Al_2O_3$ or comparable materials come into consideration as material. The photodiode is separated from the field effect transistor by a parting region 19. This parting region 19 is fashioned as an etchedout trench or as a region having insulator implant.

The standard manufacturing methods that are be employed here for the manufacture of a component corresponding to this exemplary embodiment.

We claim:

1. A monolithically integrated waveguide-photodiode-FET combination, comprising:

a carrier substrate of III-V semiconductor material;

a photodiode layer of a semiconductor material formed on said carrier substrate, said photodiode layer being lightly doped for electrical conduction of a first conductivity type;

a waveguide layer of a semiconductor material formed on said carrier substrate abutting said photodiode layer, said waveguide layer being lightly doped for electrical conduction of the first conductivity type;

a FET layer of a semiconductor material formed on said carrier substrate, said FET layer being lightly doped for electrical conduction of the first conductivity type, said photodiode layer and said waveguide layer and said FET layer being grown positioned next to one another to form a planar surface;

a cover layer of a semiconductor layer grown on said planar surface;

a first region of a photodiode being very highly doped for electrical conduction of the first conductivity type; said first region being formed in said cover layer over said photodiode layer and extending into said photodiode layer;

a second region of the photodiode being highly doped for electrical conduction of a second conductivity type, said second region being formed in said cover layer over said photodiode layer and extending into said photodiode layer;

a third region of the photodiode being doped for electrical conduction of said first conductivity type and being formed in said carrier substrate adjoining said photodiode layer and extending over an entire length of said photodiode layer;

a first contact on said second region of the photodiode;

a second contact on said first region of the photodiode;

a source region of a FET being very highly doped for electrical conduction of a first conductivity type, said source region being formed in said cover layer over said FET layer and extending into said FET layer;

a drain region of the FET being very highly doped for electrical conduction of the first conductivity type, said drain region being formed in said cover layer above said FET layer and extending into said FET layer;

a channel region of the FET being highly doped for electrical conduction of the first conductivity type and extending into said FET layer;

a gate region of the FET being formed in said cover layer;

a source contact on said source region;

a drain contact on said drain region;

a gate contact on said gate region;

a parting region separating the photodiode and the FET from one another; and a passivation layer covering a portion of said cover layer not covered by said contacts.

2. Monolithically integrated waveguide-photodiode-FET combination according to claim 1, characterized in that the first conductivity type is n-conduction and the second conductivity type is p-conduction.

3. A monolithically integrated waveguide-photodiode-FET combination according to claim 1, characterized in that the gate region is highly doped for electrical conduction of the second conductivity type; and in that the gate is fashioned as a junction gate.

4. A monolithically integrated waveguide-photodiode-FET combination according to claim 1, characterized in that the gate region is lightly doped for electrical conduction of the first conductivity type; and in that the gate contact is applied as a Schottky contact.

5. A monolithically integrated waveguide-photodiode-FET combination according to claim 1, characterized in that the passivation layer is essentially of a material selected from the group consisting of $Si_3N_4$, $SiO_2$ and $Al_2O_3$.

6. A monolithically integrated waveguide-photodiode-FET combination according to claim 1, characterized in that the carrier substrate is semi-insulating InP material; in that the photodiode layer and the FET layer are InGaAs material; and in that the cover layer is essentially of a material selected from the group consisting of InP material and As material.

7. A monolithically integrated waveguide-photodiode-FET combination according to claim 6, characterized in that the waveguide layer is essentially of a material selected from the group consisting of (In,Ga)(As,P) material and (In,Ga,Al)As material and the photodiode layer and the FET layer are $In_{0.53}Ga_{0.47}As$ material.

8. A monolithically integrated waveguide-photodiode-FET combination according to claim 1, characterized in that the parting region is fashioned with insulator implant.

* * * * *